(12) United States Patent
Ju et al.

(10) Patent No.: US 11,211,572 B2
(45) Date of Patent: Dec. 28, 2021

(54) MASK PLATE AND MANUFACTURING METHOD THEREOF, FLEXIBLE SUBSTRATE STRIPPING APPARATUS AND FLEXIBLE SUBSTRATE STRIPPING METHOD

(71) Applicant: BOE TECHNOLOGY GROUP CO., LTD., Beijing (CN)

(72) Inventors: Changcheng Ju, Beijing (CN); Jing Yu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 784 days.

(21) Appl. No.: 16/068,837

(22) PCT Filed: Dec. 19, 2017

(86) PCT No.: PCT/CN2017/117219
§ 371 (c)(1),
(2) Date: Jul. 9, 2018

(87) PCT Pub. No.: WO2018/218937
PCT Pub. Date: Dec. 6, 2018

(65) Prior Publication Data
US 2021/0210702 A1 Jul. 8, 2021

(30) Foreign Application Priority Data
Jun. 1, 2017 (CN) .......................... 201710404712.3

(51) Int. Cl.
*H01L 51/00* (2006.01)
*G03F 1/54* (2012.01)
*H01L 51/56* (2006.01)

(52) U.S. Cl.
CPC ............ *H01L 51/0097* (2013.01); *G03F 1/54* (2013.01); *H01L 51/0011* (2013.01); *H01L 51/56* (2013.01); *H01L 2251/566* (2013.01)

(58) Field of Classification Search
None
See application file for complete search history.

(56) References Cited

U.S. PATENT DOCUMENTS

2004/0192070 A1 9/2004 Tateishi
2007/0298329 A1* 12/2007 Huang ...................... G03F 1/50
430/5

(Continued)

FOREIGN PATENT DOCUMENTS

| CN | 101511744 A | 8/2009 |
| CN | 101634805 A | 1/2010 |

(Continued)

OTHER PUBLICATIONS

Marvel, R.E., et al., "Influence of deposition process and substrate on the phase transition of vanadium dioxide thin films", Acta Materialia, vol. 91, 2015, pp. 217-226, https://doi.org/10.1016/j.actamat.2015.03.009. (Year: 2015).*

(Continued)

*Primary Examiner* — J. E. Schoenholtz
(74) *Attorney, Agent, or Firm* — Collard & Roe, P.C.

(57) ABSTRACT

A mask plate and a manufacturing method thereof, a flexible substrate stripping apparatus and a flexible substrate stripping method are provided. The mask plate includes a laser-transmitting substrate and a patterned laser-shielding layer located on the laser transmitting substrate.

18 Claims, 5 Drawing Sheets

(56) References Cited

U.S. PATENT DOCUMENTS

| | | | |
|---|---|---|---|
| 2010/0041538 A1 | 2/2010 | Arai et al. | |
| 2011/0117731 A1 | 5/2011 | Park et al. | |
| 2014/0335445 A1* | 11/2014 | Kang | G03F 1/68 430/5 |
| 2015/0076458 A1 | 3/2015 | Lee et al. | |
| 2016/0023305 A1* | 1/2016 | Shi | B23K 26/0661 219/121.6 |
| 2016/0049601 A1 | 2/2016 | Hsieh et al. | |

FOREIGN PATENT DOCUMENTS

| | | |
|---|---|---|
| CN | 102063011 A | 5/2011 |
| CN | 103855171 A | 6/2014 |
| CN | 103887157 A | 6/2014 |
| CN | 105665941 A | 6/2016 |
| CN | 106773523 A | 5/2017 |
| DE | 10 2004 041 497 A1 | 3/2006 |
| KR | 10-2013-0075920 A | 7/2013 |

OTHER PUBLICATIONS

English translation of Extended European Search Report in EP Application No. 17889522.3 dated Feb. 2, 2021.

Preparation of VO2 Thin Films and Study the Effects of Doping Au on Phase-Transition Properties, Jun. 2011 (66 pages).

Strong UV Reflecting Characteristics of Cu/Ti Superlattic Films, Acta Optica Sinica, China Academic Journal Electronic Publishing House, 0253-2239 (2001) (3 pages).

International Search Report of PCT/CN2017/117219 in Chinese, dated Mar. 26, 2018 with English translation.

Notice of Transmittal of the International Search Report of PCT/CN2017/117219 in Chinese, dated Mar. 26, 2018.

Written Opinion of the International Searching Authority of PCT/CN2017/117219 in Chinese, dated Mar. 26, 2018 with English translation.

Indian Office Action in Indian Application No. 201817025730, dated Mar. 12, 2020.

\* cited by examiner

MASK PLATE AND MANUFACTURING METHOD THEREOF, FLEXIBLE SUBSTRATE STRIPPING APPARATUS AND FLEXIBLE SUBSTRATE STRIPPING METHOD

CROSS REFERENCE TO RELATED APPLICATIONS

This application is the National Stage of PCT/CN2017/117219 filed on Dec. 19, 2017, which claims priority under 35 U.S.C. § 119 of Chinese Application No. 201710404712.3 filed on Jun. 1, 2017, the disclosure of which is incorporated by reference.

The present application claims priority of China Patent application No. 201710404712.3, filed on Jun. 1, 2017, the content of which is incorporated in its entirety as portion of the present application by reference herein.

TECHNICAL FIELD

Embodiments of the present disclosure relate to a mask plate and a manufacturing method thereof, a flexible substrate stripping apparatus and a flexible substrate stripping method.

BACKGROUND

At present, organic light-emitting diode (OLED) devices have been widely used due to their advantages such as self-luminescence, black purity, high contrast, and rich colors. The technology of fabricating OLED components on flexible substrates to obtain OLED flexible display screens has become a hot research direction in the research field of OLED devices. For example, the fabrication process of the OLED flexible display screen may include: fabricating a flexible substrate (the material of the flexible substrate may be polyimide) on a base substrate (usually a glass substrate), and then fabricating OLED components on the flexible substrate, and finally striping off the flexible substrate with the OLED components from the base substrate, so that an OLED flexible display screen is finally obtained. In the fabrication process of the OLED flexible display screen, stripping off the flexible substrate from the base substrate is the key to succeed in fabricating the OLED flexible display screen.

SUMMARY

An embodiment of the present disclosure provides a mask plate comprising: a laser-transmitting substrate and a patterned laser-shielding layer located on the laser-transmitting substrate.

In an example, in a plan view of the mask plate, the patterned laser-shielding layer defines a laser-transmitting region, and the laser-transmitting region comprises at least one closed laser-transmitting sub-region.

In an example, a material of the laser-transmitting substrate is quartz glass.

In an example, a material of the laser-shielding layer is a material capable of absorbing ultraviolet light or infrared light when undergoes a phase transition, or a material of the laser-shielding layer is a super-lattice metal material.

In an example, a material of the laser-shielding layer is vanadium dioxide.

In an example, the laser-shielding layer has a thickness of 500 nm.

In an example, a same type of laser is ultraviolet light having a wavelength of 245 nm.

Another embodiment of the present disclosure provides a manufacturing method of a mask plate, comprising: depositing a laser-shielding film on the laser-transmitting substrate; and performing a patterning process on the laser-shielding film to form a patterned laser-shielding layer.

In an example, depositing the laser-shielding film on the laser-transmitting substrate comprises: heating the laser-transmitting substrate; sputtering a film layer on the laser-transmitting substrate after being heated, by using metal vanadium as a target, in an argon and oxygen atmosphere; and annealing the film layer sputtered on the laser-transmitting substrate in an oxygen or nitrogen atmosphere to obtain a vanadium dioxide film as the laser-shielding film.

In an example, a purity of the metal vanadium is 99.999%, and an oxygen partial pressure during sputtering is 0.02 to 0.05 Pascals, and heating the laser-transmitting substrate comprises: heating the laser-transmitting substrate to 550° C.

In an example, before depositing the laser-shielding film on the laser-transmitting substrate, the method further comprising: depositing an alignment material film on the laser-transmitting substrate; and performing a patterning process on the alignment material film to form a first alignment pattern.

In an example, the patterning process comprises a photolithographic process or a nanoimprint process.

Another embodiment of the present disclosure provides a stripping apparatus of a flexible substrate for stripping the flexible substrate on a base substrate, comprising any one of the above mentioned mask plates, and the apparatus further comprising: a placement device configured to place the mask plate on a side of the base substrate on which the flexible substrate is not provided; an irradiation device configured to irradiate the flexible substrate with laser via the mask plate; and a stripping device configured to strip off the flexible substrate after being irradiated by laser, from the base substrate.

In an example, the irradiation device further comprises: a heating assembly configured to heat the patterned laser-shielding layer in the mask plate to a phase transition temperature enabling the patterned laser-shielding layer to absorb ultraviolet light or infrared light and undergo a phase transition; and an irradiation assembly configured to irradiate the flexible substrate with laser via the mask plate after being heated.

In an example, a first alignment pattern is formed on the mask plate, a second alignment pattern is formed on the flexible substrate, and the placement device comprises: an alignment assembly configured to align the mask plate and the flexible substrate by using the first alignment pattern and the second alignment pattern; and a bonding assembly configured to bond the mask plate to a side of the base substrate on which the flexible substrate is not provided according to a position of the mask plate relative to the base substrate after alignment.

Another embodiment of the present disclosure provides a method for stripping off a flexible substrate from a base substrate using any one of the above mentioned flexible substrate stripping apparatuses, comprising: providing the mask plate on a side of the base substrate on which the flexible substrate is not provided; irradiating the flexible substrate with laser via the mask plate; and stripping off the flexible substrate from the base substrate after being irradiated by the laser.

In an example, the irradiating the flexible substrate with the laser via the mask plate comprises: heating the patterned laser-shielding layer in the mask plate to a phase transition temperature enabling the patterned laser-shielding layer to absorb ultraviolet light or infrared light and undergo a phase transition, and irradiating the flexible substrate with the laser via the mask plate after being heated In an example, a first alignment pattern is formed on the mask plate, a second alignment pattern is formed on the flexible substrate, and providing the mask plate on the side of the base substrate on which the flexible substrate is not provided comprises: aligning the mask plate and the flexible substrate by using the first alignment pattern and the second alignment pattern; and bonding the mask plate to a side of the base substrate on which the flexible substrate is not provided according to a position of the mask plate relative to the base substrate after alignment.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

In order to clearly illustrate the technical solution of the embodiments of the disclosure, the drawings of the embodiments will be briefly described in the following; it is obvious that the described drawings are only related to some embodiments of the disclosure. Based on the described embodiments herein, those skilled in the art can obtain other embodiment(s), without any inventive work.

DETAILED DESCRIPTION

In order to make objects, technical details and advantages of the embodiments of the present disclosure apparent, the technical solutions of the embodiments of the present disclosure will be described in a clearly and fully understandable way in connection with the drawings related to the embodiments of the disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Figure 1:
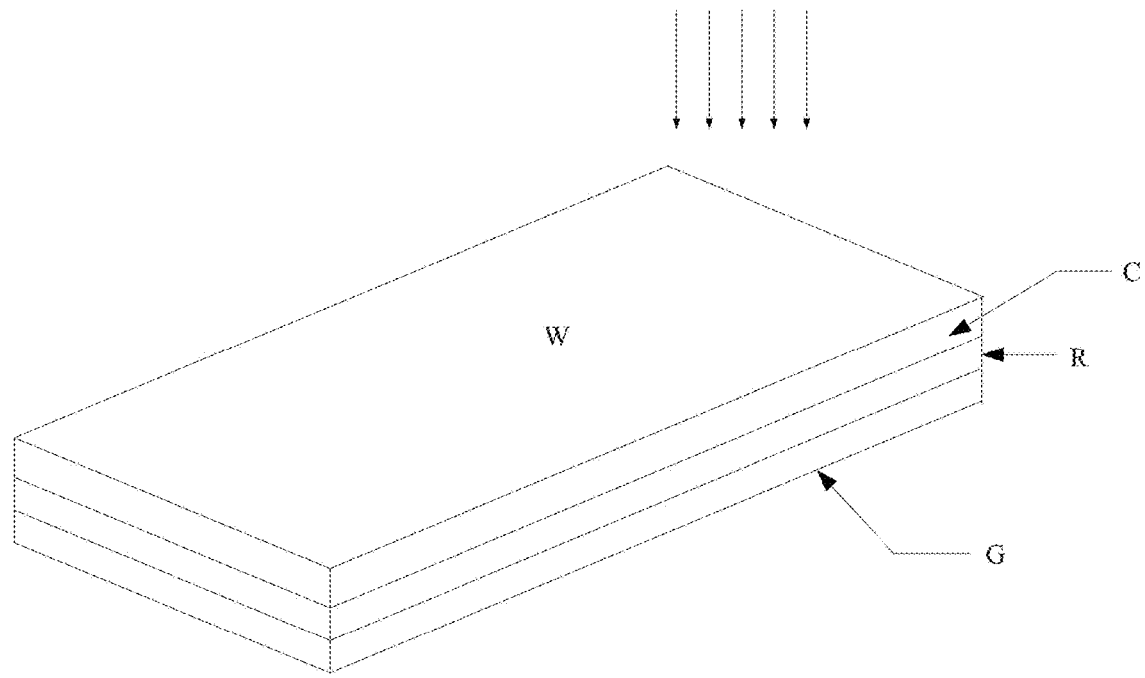
FIG. 1 is a schematic view of stripping a flexible substrate.

FIG. 1 is a schematic view of a method for stripping a flexible substrate. As illustrated in FIG. 1, a flexible substrate R can be disposed on the base substrate C, and a light emitting device layer G such as an OLED device (organic light-emitting diode) can be disposed on the flexible substrate R. In order to strip off the flexible substrate R from the base substrate C, a whole surface of a side W of the base substrate C on which the flexible substrate R is not provided can be irradiated with laser. In the irradiation process, the laser can be irradiated on the flexible substrate R by passing through the base substrate. The flexible substrate R undergoes carbonization when irradiated by the laser, thereby losing adhering force with the base substrate C. After the adhering force is lost, the flexible substrate R can be easily stripped off from the base substrate C.

Such a flexible substrate stripping method can only strip off the whole flexible substrate R from the base substrate C in one piece. It is difficult to strip a flexible substrate with an irregular shape. It is difficult to fabricate a flexible display screen with an irregular shape, thus difficult to meet the diverse needs for different shapes of flexible display in wearable electronic devices.

Figure 2:
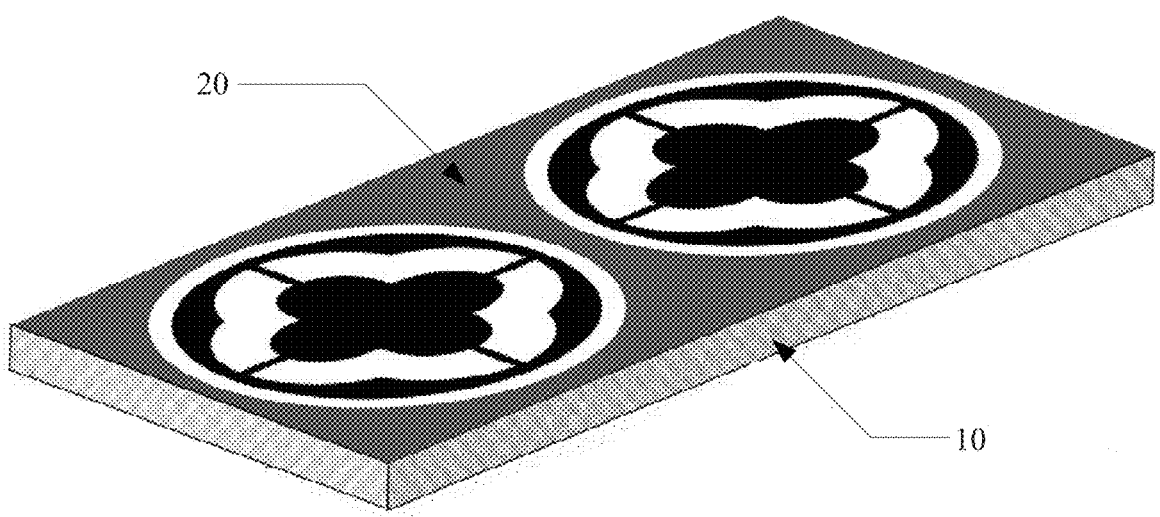
FIG. 2 is a schematic structural view of a mask plate provided by an embodiment of the present disclosure.

An embodiment of the present disclosure provides a mask plate. FIG. 2 is a schematic view of a structure of the mask plate. As illustrated in FIG. 2, the mask plate includes a laser-transmitting substrate 10 and a patterned laser-shielding layer 20 located on the laser-transmitting substrate 10. The patterned laser-shielding layer 20 overlaps with the laser-transmitting substrate 10 in a direction perpendicular to the laser transmitting substrate 10.

Laser transmittance of the laser-transmitting substrate 10 is relatively high, and laser transmittance of the laser-shielding layer 20 is relatively low. That is, the laser can easily pass through the laser-transmitting substrate 10 and is difficult to pass through the laser-shielding layer 20. For example, for laser of the same type, the laser transmittance of the laser-transmitting substrate 10 is at least 8 times of the laser transmittance of the laser protection substrate 20. In an embodiment of the present disclosure, for the same laser, such as the ultraviolet light having a wavelength of 245 nm (nanometers), the laser transmittance of the laser-transmitting substrate 10 can be 90% or more, and the laser transmittance of the laser protection substrate 20 is 10% or less.

Figure 3:
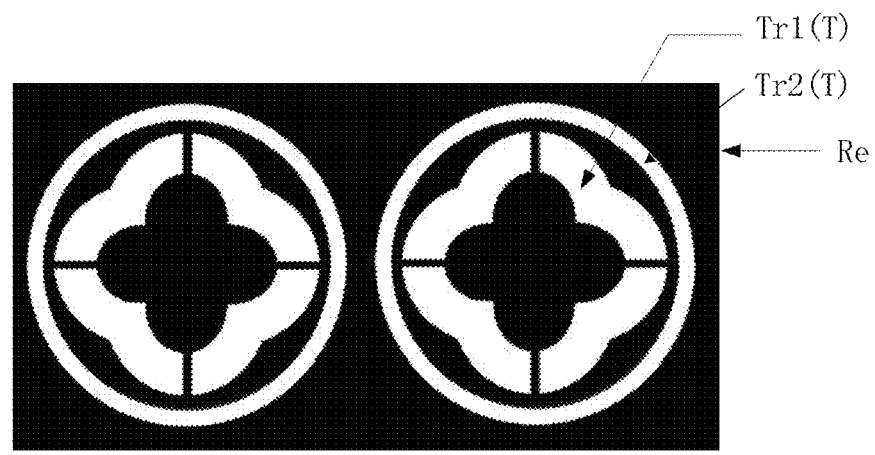
FIG. 3 is a top view of a mask plate provided by an embodiment of the present disclosure.

Please refer to FIG. 3, which illustrates a top view of a mask plate. As illustrated in FIG. 3, the mask plate includes a black region (opaque region) Re and a white region (light-transmitting area) Tr, the black region Re is defined by the patterned laser-shielding layer 20. When the laser is irradiated on the mask plate, the laser can easily pass through the white region Tr, but is more difficult to pass through the black region Re. For example, the laser transmittance of the white region Tr (light-transmitting area) can be 90% or more, and the laser transmittance of the black region Re (opaque region) is 10% or less. In the plan view of the mask plate, the laser-transmitting region Tr defined by the patterned laser-shielding layer 20 includes at least one closed laser-transmitting sub-region. For example, in FIG. 3, the laser-transmitting region Tr defined by the laser-shielding layer 20 includes two periodically arranged laser-transmitting sub-region patterns. Each laser-transmitting sub-region pattern includes four closed laser-transmitting sub-regions Tr1 and one ring-shaped closed laser-transmitting sub-region Tr2.

For example, in order to satisfy the high laser transmittance requirement of the laser-transmitting substrate 10, quartz glass can be selected as a material of the laser-transmitting substrate 10 in the embodiment of the present disclosure. Quartz glass is a single component of $SiO_2$ amorphous material, and its microstructure is a simple network consisting of $SiO_2$ tetrahedral structural units. Due to the large chemical bond energy of Si—O and the tight microstructure of quartz glass, quartz glass has good optical performance, and it has a high transmittance in the UV-to-IR continuous wavelength range. For example, fused silica glass can be used as the laser-transmitting substrate 10 in the embodiments of the present disclosure. For a UV light with wavelength of 245 nm, the laser transmittance of a fused silica glass with a thickness of 10 mm (millimeters) can reach 95% or more. It should be noted that, in some embodiments of the present disclosure, quartz glass doped with Ti ion or quartz glass doped with elements Ce and Ti can also be selected as a material of the laser-transmitting substrate 10, which is not specifically limited in this embodiment of the disclosure.

In addition, in order to meet the low laser transmittance requirement of the laser-shielding layer 20, a material capable of absorbing ultraviolet light or infrared light when undergoes a phase transition can be selected as the material of the laser-shielding layer 20 in the embodiment of the present disclosure. For example, materials such as $VO_2$, $V_2O_5$, manganese, lanthanoid oxide, $VO_x$ doped with elements such as Au and Ti, and a material formed by combining $V_2O_3$ and $V_2O_5$ with different thicknesses are used as the material of the laser-shielding layer 20. Because the above materials can absorb ultraviolet light or infrared light when undergo a phase transition, the materials have relatively low laser transmittance when undergo a phase transition, and can meet the low laser transmittance requirement of the laser-shielding layer 20.

$VO_2$ is a material capable of undergoing a phase transition as the external ambient temperature changes, and this phase transition is reversible. When $VO_2$ is a low-temperature semiconductor, when an external temperature reaches 68° C., the phase transition of $VO_2$ from a low-temperature semiconductor to a high-temperature metal phase occurs. In the phase transition from the low-temperature semiconductor to the high-temperature metal phase, $VO_2$ can absorb infrared light. Therefore, laser transmittance of $VO_2$ when undergoes a phase transition is relatively low. However, visible light transmittance of the $VO_2$ when undergoes a phase transition is basically unchanged, therefore, phase change does not cause significant visual changes to $VO_2$, avoiding affecting the work of an alignment camera in subsequent process. The alignment camera is used to align the mask plate. In an embodiment of the present disclosure, a laser-shielding layer 20 can be fabricated using $VO_2$ with a thickness of 500 nm.

For example, in addition to selecting a material capable of absorbing ultraviolet light or infrared light when undergoes a phase transition as a material of the laser-shielding layer 20, a super-lattice metal material can also be selected as the material of the laser-shielding layer 20. Because the super-lattice metal has a high reflectivity to the laser, the laser is difficult to transmit through the super-lattice metal. Therefore, the super-lattice metal material can meet the low laser transmittance requirement of the laser-shielding layer 20, and the super-lattice metal material is not easily damaged by the laser, so its durability is better.

In an embodiment of the present disclosure, Cu/Ti super-lattice metal material with a period of 30 layers can be selected as the material of the laser-shielding layer 20, and the Cu/Ti super-lattice metal material with a period of 30 layers has reflectivity more than 90% to ultraviolet laser with a wavelength of 200 nm. Of course, for example, other super-lattice metal materials, such as Nb/Cu material, Ta/Al material, Ti/Al/Ti material, etc. can also be selected as the material of the laser-shielding layer 20 in the embodiment of the present disclosure. Furthermore, in the embodiment of the present disclosure, a super-lattice metal semiconductor material, such as Mo/Si material, Ru/Si material, Rh/Si material, Tc/Si material, etc., can also be selected as the material of the laser-shielding layer 20, limitations are not imposed by the embodiments of the present disclosure.

Optionally, the mask plate can further include an alignment pattern. For example, the alignment pattern is disposed on the laser-transmitting substrate 10, and used for aligning the mask plate.

Figure 4:
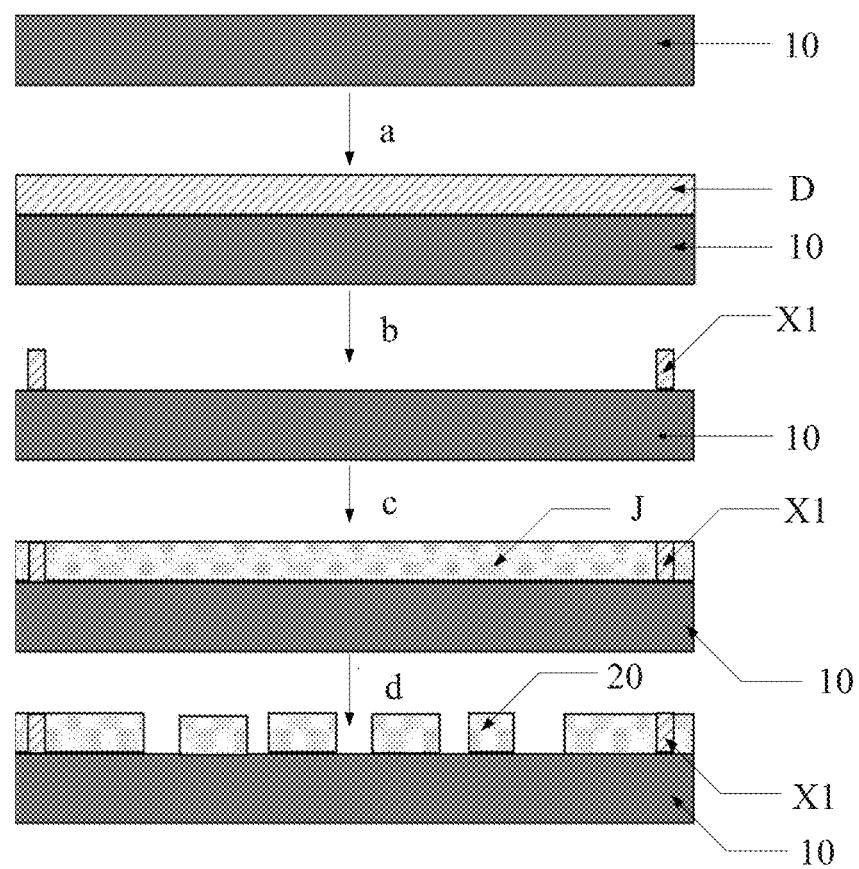
FIG. 4 is a schematic diagram of a manufacturing process of a mask plate provided by an embodiment of the present disclosure.

Hereinafter, a manufacturing method of the mask plate provided by an embodiment of the present disclosure will be described. FIG. 4 illustrates a schematic diagram of a manufacturing process of the mask plate. As illustrated in FIG. 4, the manufacturing method can include following steps.

a. depositing an alignment material film D on the laser-transmitting substrate 10.

Before depositing the alignment material film D, it is necessary to clean the laser-transmitting substrate 10 by a standard method. Optionally, a material of the laser-transmitting substrate 10 can be quartz glass. After cleaning, the alignment material film D can be deposited by sputtering or chemical vapor deposition. Optionally, a material of the alignment material film D can be metal Mo, and a deposition thickness of the alignment material film D can be 200 nm.

b. performing a patterning process on the alignment material film D to form a first alignment pattern X1.

For example, the patterning process can be a photolithography process or a nanoimprint process. After the patterning process is performed, a first alignment pattern X1 can be obtained. The first alignment pattern X1 can be in a cross shape, a square shape, or the like. Limitations are not imposed in this embodiment of the present disclosure. The first alignment pattern X1 can be located at an edge of the laser-transmitting substrate 10, which is not limited in this embodiment of the disclosure.

For example, the photolithography process can include: forming a photoresist layer on the laser-transmitting substrate 10 by a coating process, exposing the photoresist layer through a photolithography mask plate by an exposure process, developing the photoresist layer to obtain a photoresist pattern by a development process, and then performing an etching process to finally obtain the first alignment pattern X1. The etching process can be a wet etching process, or an inductively coupled plasma (ICP) etching process, etc., which is not specifically limited in this embodiment of the disclosure.

c. depositing a laser-shielding film J on the laser-transmitting substrate 10.

For example, a material of the laser-shielding film J can be a material capable of absorbing ultraviolet light or infrared light when undergoes a phase transition or a super-lattice metal material. The following describes the deposition method of the laser-shielding film J by taking $VO_2$ or Cu/Ti super-lattice metal as material of laser-shielding film J as examples.

In a case that the material of the laser-shielding film J is $VO_2$, the laser-shielding film J can be deposited on the laser-transmitting substrate 10 by sputtering. Optionally, metal V having a purity of 99.999% can be used as a target material in the embodiment of the present disclosure, and VO$_2$ film layer is obtained by heating the laser-transmitting substrate 10 to 550° C. and sputtering in an atmosphere of argon and oxygen, and in which the partial pressure of oxygen is 0.02 to 0.05 Pascals, and then annealing the film layer on the laser-transmitting substrate 10 by sputtering, in an oxygen or nitrogen atmosphere, which is also the laser-shielding film J described above.

In a case that the material of the laser-shielding layer J is Cu/Ti super-lattice metal material, the laser-shielding film J can be deposited on the laser-transmitting substrate 10 by sputtering. Optionally, in the embodiments of the present disclosure, Cu and Ti can be alternately deposited under an argon atmosphere with a sputtering power of 300 W. In an embodiment of the present disclosure, a thickness ratio of Cu to Ti can be 1:3. In an embodiment of the present disclosure, a super-lattice period of Cu and Ti can be 35. It should be noted that, in order to obtain a large adhesion between the Cu/Ti super-lattice metal thin film and the laser-transmitting substrate 10, a Ti metal film with a thickness of 10 nm can be firstly deposited on the laser-transmitting substrate 10 to obtain Cu/Ti super-lattice metal film with a better quality so as to serves as the laser-shielding film J.

d. performing a patterning process on the laser-shielding film J to form a patterned laser-shielding layer 20.

For example, the above-described patterning process can also be a photolithography process or a nanoimprint process, and the patterned laser-shielding layer 20 can be obtained after the patterning process.

For example, the photolithography process can also include: a coating process, an exposure process, a development process, and an etching process. The specific process flow is the same as described above, and repeated portions will be omitted here.

Figure 5:
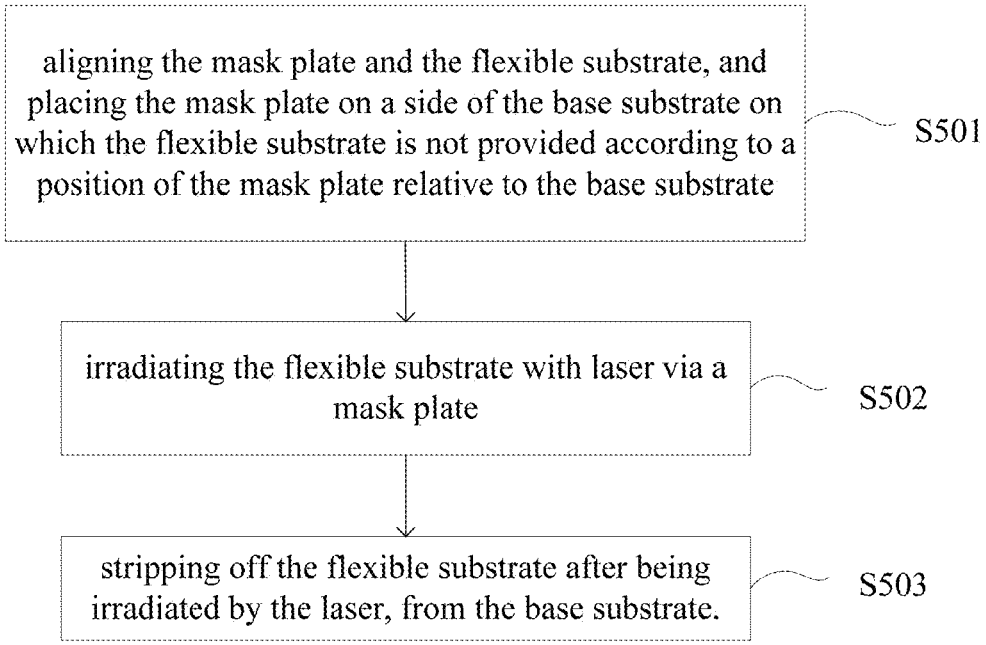
FIG. 5 is a flowchart of a method for stripping a flexible substrate provided by an embodiment of the present disclosure.

Hereinafter, a method for stripping a flexible substrate by using the above mask plate provided by an embodiment of the present disclosure will be described. FIG. 5 illustrates a flow chart of a method for stripping a flexible substrate by using the above mask plate. As illustrated in FIG. 5, the method includes the following steps.

Step 501, aligning the mask plate and the flexible substrate, and placing the mask plate on a side of the base substrate on which the flexible substrate is not provided according to a position of the mask plate relative to the base substrate after alignment.

Figure 6:
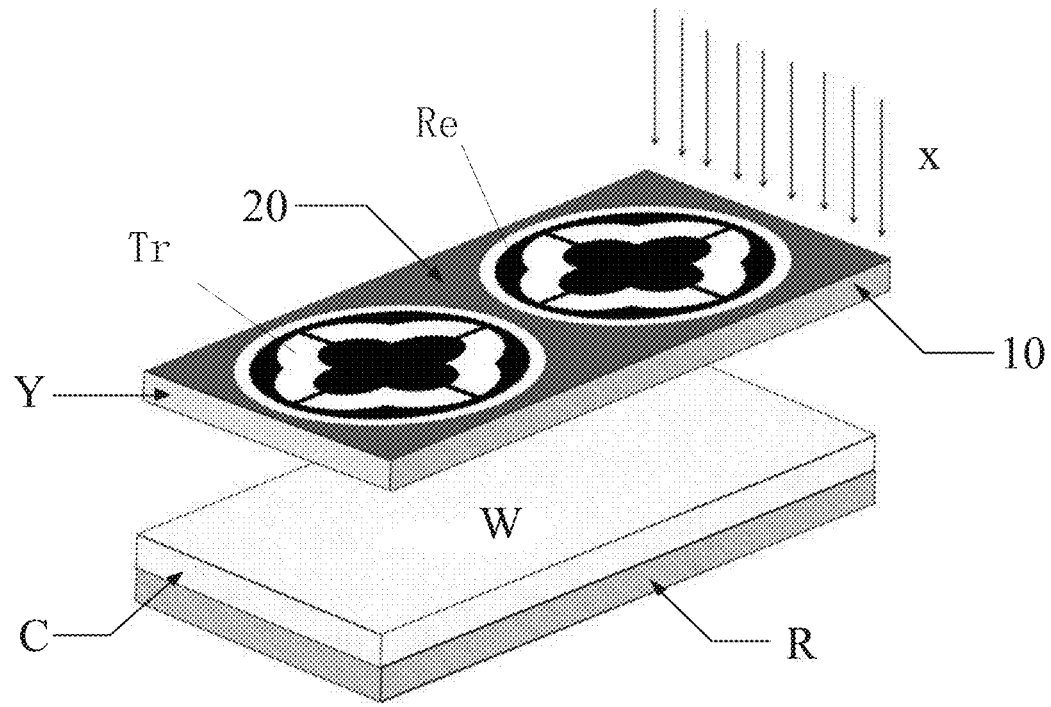
FIG. 6 is a schematic view of a relative position of a mask plate and a base substrate when stripping a flexible substrate provided by an embodiment of the present disclosure.

FIG. 6 is a schematic view of a relative position of the mask plate and the flexible substrate, when the flexible substrate is striped off from the base substrate. As illustrated in FIG. 6, when the flexible substrate R is striped off (the light emitting device layer G provided on the flexible substrate R is not illustrated in FIG. 6), the mask plate Y can be provided on a side W of the base substrate C on which the flexible substrate R is not provided. Optionally, in the embodiment of the present disclosure, the mask plate Y can be bonded onto the side W of the base substrate C on which the flexible substrate R is not provided, so that the laser can be prevented from being refracted in the laser-transmitting substrate 10 and then being diverged between the mask plate Y and the base substrates C so as to avoid the flexible substrate located under the laser-shielding layer 20 to be irradiated.

For example, a first alignment pattern can be formed on the mask plate, and a second alignment pattern can be formed on the flexible substrate or on the light emitting device disposed on the flexible substrate. In the embodiment of the present disclosure, during placing the mask plate Y on a side W of the base substrate C on which the flexible substrate R is not provided, the first alignment pattern and the second alignment pattern can be used to align the mask plate and the flexible substrate, and the mask plate is placed on the side of the base substrate on which the flexible substrate is not provided according to a position of the mask plate relative to the base substrate after alignment.

Step 502, irradiating the flexible substrate with laser via a mask plate.

As illustrated in FIG. 6, the laser can be irradiated in an x direction. That is, the laser can be irradiated onto the flexible substrate R disposed on the base substrate C via the mask plate Y. Because the laser transmittance of the black region (opaque region) Re of the mask plate is relatively low, and the laser transmittance of the white region (laser-transmitting region) Tr is relatively high, the laser can pass through the white region (laser-transmitting region) Tr, and is difficult to pass through the black region (opaque region) Re. Therefore, a portion of the flexible substrate R located directly under the black region (opaque region) Re is not irradiated with the laser, and a portion of the flexible substrate R not directly located below the black region (opaque region) Re is irradiated with the laser, so that a pattern of the portion of the flexible substrate R irradiated by the laser is exactly complementary to a pattern of the laser-shielding layer 20. The portion of the flexible substrate R being irradiated by the laser is denatured by carbonization and loses adhering force with the base substrate C.

For example, the laser used in step 502 can be excimer laser, and the excimer laser belongs to ultraviolet light with a wavelength ranging in 157-353 nm, among which the more common wavelengths are 157 nm, 193 nm, 248 nm, and 308 nm, etc.

It should be noted that, as described above, the material of the laser-shielding layer 20 can be a material capable of absorbing ultraviolet light or infrared light when undergoes a phase transition. For the laser-shielding layer 20 made of this material, it is necessary to heat the laser-shielding layer 20 to the phase transition temperature before laser irradiation, so as to ensure the laser protection effect. Here, the phase transition temperature refers to a temperature at which the laser-shielding layer can absorb ultraviolet light or infrared light when undergoes a phase transition. For example, in a case that the material of the laser-shielding layer 20 is VO$_2$, before the laser irradiation, the laser-shielding layer 20 needs to be heated to 68° C. which is the phase transition temperature of VO$_2$.

Step 503, stripping off the flexible substrate from the base substrate after being irradiated by the laser.

A portion of the flexible substrate R irradiated by the laser is denatured by carbonization and loses adhering force with the base substrate C. Therefore, the portion of the flexible substrate R irradiated by the laser can be stripped off from the base substrate C, and the shape of the portion of the flexible substrate being striped-off is complementary to the shape of the laser-shielding layer 20 in the mask plate.

After the stripping process, the portion of the flexible substrate R obtained after being stripped off can be encapsulated by using a water-and-oxygen blocking film material, and the flexible display device after being encapsulated can be tested and analyzed.

It should be noted that, before step 502, the light emitting device layer G is cut by laser to obtain a profile of the light emitting device and define a device region and a region to be stripped. The portion of the flexible substrate R striped from the base substrate C in the above step 503 can correspond to the device region defined before the step 502. For example, in a plan view of the flexible substrate R, the portion of the flexible substrate R striped off from the base substrate C through the step 503 is greater than or equal to the device region defined before the step 502.

In summary, the embodiment of the present disclosure provides a mask plate including a laser-transmitting substrate and a patterned laser-shielding layer on the laser-transmitting substrate, and the mask plate is placed on a side of the base substrate on which the flexible substrate is not provided during stripping the flexible substrate, and the flexible substrate is irradiated with a laser through the mask plate. Because the mask plate includes a patterned laser-shielding layer, in the process of laser irradiation, the laser-shielding layer can be employed to ensure that a portion of the flexible substrate directly under the opaque region of the laser-shielding layer is not irradiated by the laser, but a portion of the flexible substrate not directly located under the opaque region of the laser light shielding layer is irradiated with the laser, so that a pattern of the flexible substrate irradiated with the laser is exactly complementary to a pattern of the laser laser-shielding layer. The portion of the flexible substrate irradiated with the laser is striped off from the base substrate to obtain a flexible display screen with an irregular shape complementary to the pattern of the laser-shielding layer.

Figure 7:
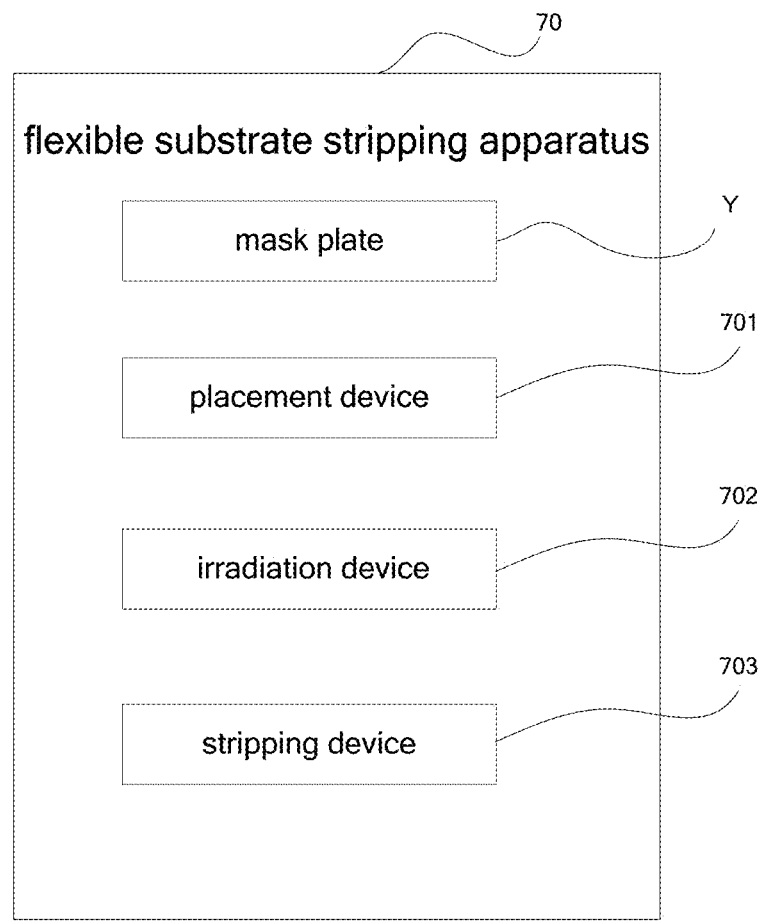
FIG. 7 is a block diagram of a flexible substrate stripping apparatus provided by an embodiment of the present disclosure.

FIG. 7 illustrates a flexible substrate stripping apparatus 70 according to an embodiment of the present disclosure. As illustrated in FIG. 7, a flexible substrate stripping apparatus 70 includes a mask plate Y as illustrated in FIG. 2, a placement device 701, and an irradiation device 702 and a stripping device 703.

The placement device 701 is configured to place the mask plate Y on a side of the base substrate on which the flexible substrate is not provided.

The irradiation device 702 is configured to irradiate the flexible substrate with the laser through the mask plate Y.

This stripping device 703 is configured to strip off the flexible substrate from the base substrate after being irradiated by the laser.

Figure 8:
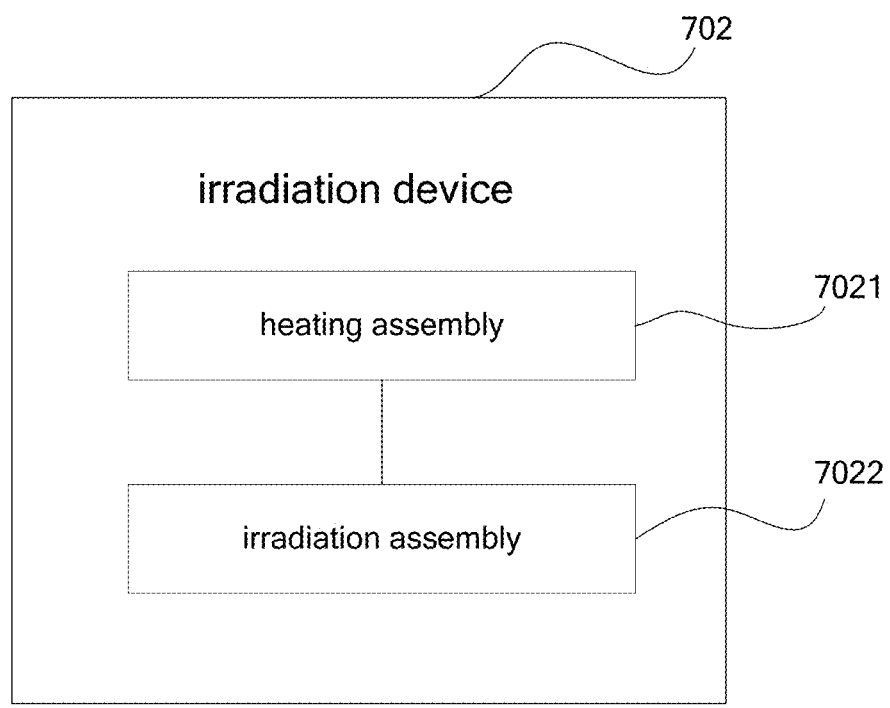
FIG. 8 is a block diagram of an irradiation device provided by an embodiment of the present disclosure.

As illustrated in FIG. 8, in an embodiment of the present disclosure, the irradiation device 702 further includes:

a heating assembly 7021 configured to heat the laser-shielding layer on the mask plate Y to a phase transition temperature at which the laser-shielding layer is capable of absorbing ultraviolet light or infrared light and undergoes a phase transition; and an irradiation assembly 7022 configured to irradiate the flexible substrate with the laser via the mask plate Y after being heated.

Figure 9:
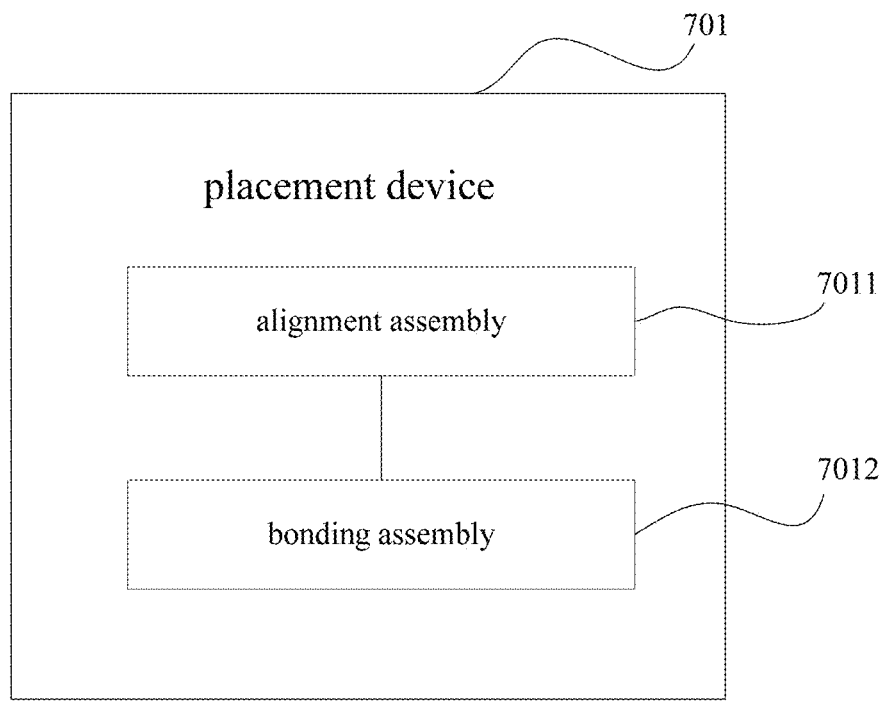
FIG. 9 is a block diagram of a placement device provided by an embodiment of the present disclosure.

As illustrated in FIG. 9, in an embodiment of the present disclosure, a first alignment pattern is formed on the mask plate Y, a second alignment pattern is formed on the flexible substrate, and the placement device 701 includes:

an alignment assembly 7011 configured to align the mask plate Y and the flexible substrate by using the first alignment pattern and the second alignment pattern, and a bonding assembly 7022 configured to bond the mask plate Y to a side of the base substrate on which the flexible substrate is not provided according to a position of the mask plate Y relative to the base substrate after being aligned In summary, the flexible substrate stripping apparatus provided by the embodiment of the present disclosure provides a mask plate including a laser-transmitting substrate and a patterned laser-shielding layer on the laser-transmitting substrate, and in the process of striping off the flexible substrate, the mask plate is placed on a side of the base substrate on which the flexible substrate is not provided, and then the flexible substrate is irradiated with a laser via the mask plate. Because the mask plate includes the patterned laser-shielding layer, during the laser irradiation, the laser-shielding layer can be employed to ensure that a portion of the flexible substrate directly under the opaque region of the laser-shielding layer is not irradiated with a laser, and a portion of the flexible substrate not directly under the opaque region of the laser-shielding layer can be irradiated with a laser. Therefore, a pattern of the portion of the flexible substrate irradiated with the laser is exactly complementary to a pattern of the laser-shielding layer, and the portion of the flexible substrate irradiated with the laser is striped off from the substrate to obtain a flexible display screen with an irregular shape complementary to the pattern of the laser-shielding layer.

With respect to the devices in the above embodiments, the specific manners in which the various devices and components perform operations have been described in detail in the embodiments of the related methods, and no detailed description will be made herein.

The foregoing descriptions are merely exemplary embodiments of the present disclosure and are not intended to limit the present disclosure. Any modification, equivalent replacement, or improvement made within the spirit and principle of the present disclosure shall be included in the protection scope of the present disclosure.

What is claimed is:

1. A mask plate for stripping a flexible substrate comprising: a laser-transmitting substrate and a patterned laser-shielding layer located on the laser-transmitting substrate, wherein a material of the patterned laser-shielding layer is a material capable of absorbing ultraviolet light or infrared light when undergoes a phase transition, comprising manganese, lanthanoid oxide, VOx doped with elements including Au and Ti, and a material formed by combining $V_2O_3$ and $V_2O_5$ with different thicknesses or a material of the patterned laser-shielding layer is a super-lattice metal material.

2. The mask plate according to claim 1, wherein in a plan view of the mask plate, the patterned laser-shielding layer defines a laser-transmitting region, and the laser-transmitting region comprises at least one closed laser-transmitting sub-region.

3. The mask plate according to claim 1, wherein a material of the laser-transmitting substrate is quartz glass.

4. The mask plate according to claim 1, wherein the VOx is vanadium dioxide.

5. The mask plate according to claim 4, wherein the patterned laser-shielding layer has a thickness of 500 nm.

6. The mask plate according to claim 1, wherein laser of a same type is ultraviolet light having a wavelength of 245 nm.

7. A manufacturing method of a mask plate, comprising:
depositing a laser-shielding film on the laser-transmitting substrate; and
performing a patterning process on the laser-shielding film to form a patterned laser-shielding layer, wherein
a material of the patterned laser-shielding layer is a material capable of absorbing ultraviolet light or infrared light when undergoes a phase transition, comprising manganese, lanthanoid oxide, VOx doped with elements including Au and Ti, and a material formed by combining $V_2O_3$ and $V_2O_5$ with different thicknesses or
a material of the laser-shielding layer is a super-lattice metal material.

8. The method according to claim 7, wherein the depositing the laser-shielding film on the laser-transmitting substrate comprises:
   heating the laser-transmitting substrate;
   sputtering a film layer on the laser-transmitting substrate after being heated, by using metal vanadium as a target, in an argon and oxygen atmosphere; and
   annealing the film layer sputtered on the laser-transmitting substrate in an oxygen or nitrogen atmosphere to obtain the laser-shielding film wherein the VOx is vanadium dioxide.

9. The method according to claim 8, wherein a purity of the metal vanadium is 99.999%, and an oxygen partial pressure during the sputtering is 0.02 to 0.05 Pascals, and the heating the laser-transmitting substrate comprises:
   heating the laser-transmitting substrate to 550° C.

10. The method according to claim 7, before the depositing the laser-shielding film on the laser-transmitting substrate, the method further comprising:
    depositing an alignment material film on the laser-transmitting substrate; and
    performing a patterning process on the alignment material film to form a first alignment pattern.

11. The method according to claim 7, wherein the patterning process comprises a photolithographic process or a nanoimprint process.

12. A flexible substrate stripping apparatus for stripping off a flexible substrate from a base substrate, comprising the mask plate of claim 1, and the apparatus further comprising:
    a placement device configured to place the mask plate on a side of the base substrate on which the flexible substrate is not provided;
    an irradiation device configured to irradiate the flexible substrate with laser via the mask plate; and
    a stripping device configured to strip off the flexible substrate after being irradiated by laser, from the base substrate.

13. The apparatus according to claim 12, wherein the irradiation device further comprises:
    a heating assembly configured to heat the patterned laser-shielding layer in the mask plate to a phase transition temperature enabling the patterned laser-shielding layer to absorb ultraviolet light or infrared light and undergo a phase transition; and
    an irradiation assembly configured to irradiate the flexible substrate with laser via the mask plate after being heated.

14. The apparatus according to claim 12, wherein a first alignment pattern is formed on the mask plate, a second alignment pattern is formed on the flexible substrate, and the placement device comprises:
    an alignment assembly configured to align the mask plate and the flexible substrate by using the first alignment pattern and the second alignment pattern; and
    a bonding assembly configured to bond the mask plate to a side of the base substrate on which the flexible substrate is not provided according to a position of the mask plate relative to the base substrate after alignment.

15. A method for stripping off a flexible substrate from a base substrate by using the flexible substrate stripping apparatus according to claim 12, comprising:
    providing the mask plate on a side of the base substrate on which the flexible substrate is not provided;
    irradiating the flexible substrate with laser via the mask plate; and
    stripping off the flexible substrate from the base substrate after being irradiated by the laser.

16. The method according to claim 15, wherein the irradiating the flexible substrate with the laser via the mask plate comprises:
    heating the patterned laser-shielding layer in the mask plate to a phase transition temperature enabling the patterned laser-shielding layer to absorb ultraviolet light or infrared light and undergo a phase transition, and
    irradiating the flexible substrate with the laser via the mask plate after being heated.

17. The method according to claim 15, wherein a first alignment pattern is formed on the mask plate, a second alignment pattern is formed on the flexible substrate, and providing the mask plate on the side of the base substrate on which the flexible substrate is not provided comprises:
    aligning the mask plate and the flexible substrate by using the first alignment pattern and the second alignment pattern; and
    bonding the mask plate to a side of the base substrate on which the flexible substrate is not provided according to a position of the mask plate relative to the base substrate after alignment.

18. The mask plate according to claim 2, wherein a material of the laser-transmitting substrate is quartz glass.

* * * * *

UNITED STATES PATENT AND TRADEMARK OFFICE
CERTIFICATE OF CORRECTION

PATENT NO. : 11,211,572 B2
APPLICATION NO. : 16/068837
DATED : December 28, 2021
INVENTOR(S) : Ju et al.

It is certified that error appears in the above-identified patent and that said Letters Patent is hereby corrected as shown below:

In the Claims

Column 10, Line 49 (Claim 5) please change "The mask plate according to claim 4, ..." to correctly read: -- The mask plate according to claim 1, ... --

Signed and Sealed this
Twenty-fourth Day of May, 2022

Katherine Kelly Vidal
*Director of the United States Patent and Trademark Office*